United States Patent
Saiki (10) Patent No.: US 6,583,366 B2
(45) Date of Patent: Jun. 24, 2003

(54) SUBSTRATE HAVING PINS

(75) Inventor: Hajime Saiki, Aichi (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 09/827,555

(22) Filed: Apr. 6, 2001

(65) Prior Publication Data

US 2001/0046796 A1 Nov. 29, 2001

(30) Foreign Application Priority Data

Apr. 13, 2000 (JP) ............................. 2000-111598
Dec. 5, 2000 (JP) ............................. 2000-370311

(51) Int. Cl.[7] .......................... H19R 12/04; H05K 1/11
(52) U.S. Cl. ........................................ 174/267; 439/83
(58) Field of Search .................. 439/876, 83; 174/267; 361/774; 257/697

(56) References Cited

U.S. PATENT DOCUMENTS

| | | | | |
|---|---|---|---|---|
| 5,373,110 A | * | 12/1994 | Inasaka | 174/267 |
| 5,861,663 A | * | 1/1999 | Isaacs et al. | 257/697 |
| 6,049,039 A | * | 4/2000 | Fushimi | 174/68.1 |
| 6,054,652 A | * | 4/2000 | Moriizumi et al. | 174/261 |
| 6,359,332 B2 | * | 3/2002 | Shiraishi | 257/697 |
| 6,376,782 B1 | * | 4/2002 | Kimura et al. | 174/267 |
| 2002/0004324 A1 | * | 1/2002 | Saiki et al. | 439/83 |
| 2002/0088844 A1 | * | 7/2002 | Saiki et al. | 228/248.1 |
| 2002/0096361 A1 | * | 7/2002 | Saiki et al. | 174/267 |

FOREIGN PATENT DOCUMENTS

| | | | | |
|---|---|---|---|---|
| JP | 4-267544 | 9/1992 | ........... | H01L/23/13 |
| JP | 2000-049252 | 2/2000 | ........... | H01L/23/12 |

\* cited by examiner

Primary Examiner—Lynn D. Feild
Assistant Examiner—Hae Moon Hyeon
(74) Attorney, Agent, or Firm—Brinks, Hofer, Gilson and Lione (57) ABSTRACT

A substrate includes at least one pin and solder. The substrate has a main surface and a substantially plate-like shape and comprises a pin pad exposed on the main surface. The pin comprises a shaft portion and an enlarged diameter portion (a flange) greater in diameter than the shaft portion and formed at one end of the shaft portion. The enlarged diameter portion comprises a shaft side plane located on the same side as the shaft portion, and a spherical surface swelling in opposition to the shaft portion. The solder is adapted to join the pin pad and at least the enlarged diameter portion of the pin. The solder extends from the pin pad beyond the circumferential edge of the shaft side plane of the enlarged diameter portion and spreads on the shaft side plane through wetting in such a manner as not to reach the shaft portion.

9 Claims, 4 Drawing Sheets

PRIOR ART

SUBSTRATE HAVING PINS

BACKGROUND OF THE INVENTION

1. Field of the Invention

The present invention relates to a substrate having pins serving as input/output terminals arranged in a standing condition, and more particularly to a substrate having enhanced joining strength between pins and a substrate.

2. Description of Related Art

Figure 4:
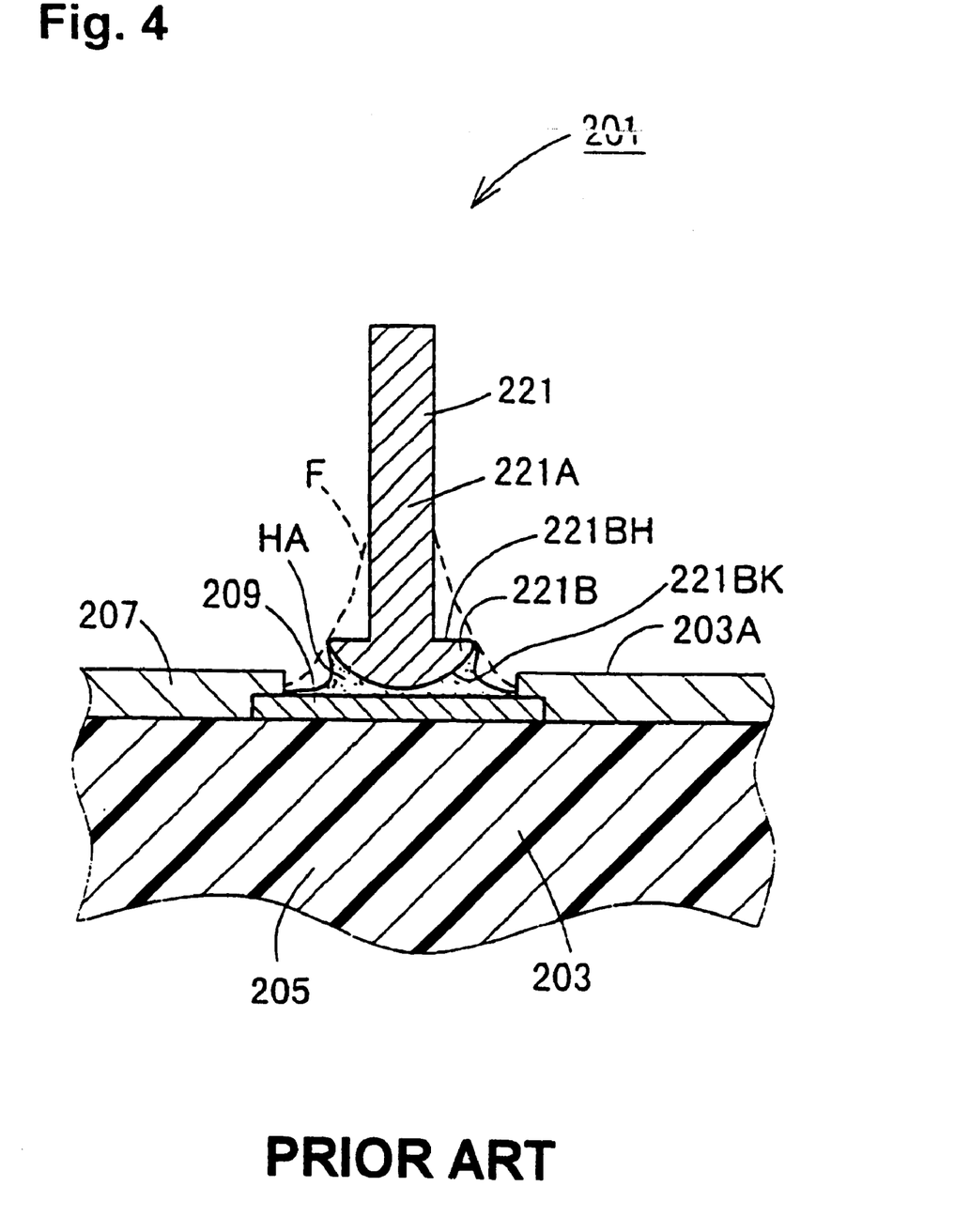
FIG. 4 is an enlarged, sectional view of a conventional (prior art) upright pin-joined substrate.

There is known an upright pin-joined (pin grid array) substrate serving as input/output terminals arranged in a standing condition. An example of such a prior art upright pin-joined substrate is shown in FIG. 4, which is a partially enlarged sectional view of an upright pin-joined substrate 201. The upright pin-joined substrate 201 includes a substrate 203 having a substantially rectangular plate-like shape and a number of pins 221 arranged on the substrate 203 in a standing condition.

The substrate 203 includes a dielectric layer 205 having wiring layers (not shown) formed in the interior and on the surface thereof, and a number of pin pads 209 exposed through a solder resist layer 207 on the side of a main surface 203A.

The pin 221 includes a substantially cylindrical shaft portion 221A and an enlarged diameter portion 221B formed at the lower end of the pin 221 and swelling substantially hemispherically toward the corresponding pin pad 209. The pin 221 is fixedly joined to the substrate 203 such that the enlarged diameter portion 221B is fixedly joined to the pin pad 209 by means of solder HA.

The upright pin-joined substrate 201 has the following feature. Since the enlarged diameter portion 221B of the pin 221 assumes a substantially hemispherical shape, a larger amount of solder HA can reside between the enlarged diameter portion 221B and the pin pad 209 as compared with, for example, a pin having a flat headed, enlarged diameter portion. Since the enlarged diameter portion 221B is substantially hemispherical, stress imposed on the pin 221 does not concentrate at a specific point, but tends to be absorbed by the entire joint portion.

Accordingly, as compared with an upright pin-joined substrate using pins each having a flat headed, enlarged diameter portion, the upright pin-joined substrate 201 can provide enhanced joining strength between the pin 221 and the substrate 203 (pin pad 209).

However, when the amount of solder HA for joining the pin 221 and the pin pad 209 is small, the joining strength between the pin 221 and the pin pad 209 becomes insufficient. As a result, when stress is imposed on the pin 221, the joint portion may fracture.

Specifically, as shown in FIG. 4, when solder HA is joined through fusion to merely a spherical surface 221BK of the enlarged diameter portion 221B and is thus constricted, stress imposed on the pin 221 tends to concentrate in the vicinity of the constricted portion of solder HA, potentially causing fracture of solder HA at the constricted portion.

Also, when the amount of solder HA for joining the pin 221 and the pin pad 209 is excessively large, stress imposed on the pin 221 may cause fracture of the joint portion.

Specifically, as illustrated with the dashed line in FIG. 4, solder HA spreads, through wetting, over the entire shaft side plane 221BH of the enlarged diameter portion 221B up to the shaft portion 221A in such a manner as to form a large fillet F on the shaft side plane 221BH.

In this case, when stress is imposed on the pin 221, the pin 221 is unlikely to deform, because of a large amount of solder HA joined through fusion to the shaft portion 221A thereof; i.e., the pin 221 is unlikely to absorb the stress. As a result, the stress is imposed directly on the joint portion, potentially causing fracture of the joint portion.

The pin 221 having the substantially hemispherical, enlarged diameter portion 221B generally has a higher barycenter of the enlarged diameter portion 221B than does a pin having a flat headed, enlarged diameter portion. As a result, when the amount of solder HA is large, stress imposed on the pin 221 tends to cause fracture of solder HA at the joint portion.

Because of the spherical surface 221BK, the pin 221 is thicker in the enlarged diameter portion 221B than is a pin having a flat headed, enlarged diameter portion. Thus, when the large fillet F is formed on the shaft side plane 221BH, the strength of the joint portion becomes rather weak.

SUMMARY OF THE INVENTION

The present invention provides a substrate having at least one pin comprising a substrate, a pin, and solder. The substrate has a main surface and a substantially plate-like shape and comprises a pin pad exposed on the main surface. The pin comprises a shaft portion and an enlarged diameter portion (a flange) greater in diameter than the shaft portion and formed at one end of the shaft portion. The enlarged diameter portion comprises a shaft side plane located on the same side as the shaft portion, and a spherical surface swelling in opposition to the shaft portion. The solder is adapted to join the pin pad and at least the enlarged diameter portion of the pin. The solder extends from the pin pad beyond the circumferential edge of the shaft side plane of the enlarged diameter portion and spreads on the shaft side plane through wetting in such a manner as not to reach the shaft portion. Alternatively, the solder extends from the pin pad beyond the circumferential edge of the shaft side plane of the enlarged diameter portion and spreads, through wetting, over the entire shaft side plane up to the shaft portion in such a manner as to form a fillet on the shaft side plane with an angle formed between a fillet surface and the shaft side plane not exceeding 50 degrees.

According to the present invention, the solder for joining the pin and the pin pad extends from the pin pad beyond the circumferential edge of the shaft side plane of the enlarged diameter portion and spreads on the shaft side plane through wetting in such a manner as not to reach the shaft portion. Alternatively, the solder for joining the pin and the pin pad extends from the pin pad beyond the circumferential edge of the shaft side plane of the enlarged diameter portion and spreads, through wetting, over the entire shaft side plane up to the shaft portion in such a manner as to form a fillet on the shaft side plane. The fillet is relatively small such that the angle formed between the surface of the fillet and the shaft side plane is not greater than 50 degrees.

When the solder extends beyond the circumferential edge of the shaft side plane onto the shaft side plane through wetting, the solder extending between the pin pad and the shaft side plane of the enlarged diameter portion forms a fillet assuming substantially the form of a truncated cone. Thus, a sufficient amount of solder is present for joining the pin and the pin pad, thereby suppressing fracture of the joint portion that would otherwise result from insufficiency of solder when stress is imposed on the pin.

Even in the case where a solder fillet is formed on the shaft side plane of the enlarged diameter portion, when stress is imposed on the pin, the pin itself is deformed to some extent to thereby absorb the stress, because the fillet is relatively small. Thus, stress imposed on the joint portion is lessened. As a result, the joint portion becomes unlikely to fracture.

The pin having the hemispherical, enlarged diameter portion has a higher barycenter of the enlarged diameter portion than does a pin having a flat headed, enlarged diameter portion, because of the hemispherical profile of the enlarged diameter portion. However, since the fillet is relatively small, even when stress is imposed on the pin, the joint portion becomes unlikely to fracture.

As described above, the upright pin-joined substrate of the present invention exhibits resistance to fracture potentially caused by stress imposed on a pin, to thereby enhance reliability.

The pin is not particularly limited, so long as the pin includes the above-mentioned shaft portion and enlarged diameter portion. The shaft portion and the enlarged diameter portion may be integrally formed into a pin from pure copper (oxygen-free copper), 194-alloy (copper alloy), Koval (iron-nickel-cobalt alloy), 42-alloy (iron-nickel alloy), or a like alloy. Alternatively, the shaft portion and the enlarged diameter portion may be joined into a pin, or a portion of the enlarged diameter portion may be joined to the remaining portion of the enlarged diameter portion to thereby form a pin (for example, a substantially hemispherical member is joined to a flat headed pin). Further alternatively, a plurality of members of different materials may be joined into a pin (for example, a substantially hemispherical member made of a brazing filler metal, such as eutectic silver brazing filler metal, is joined to a flat headed pin made of Koval).

The substrate is not particularly limited, so long as a pin pad is exposed on the main surface thereof. The substrate may be a resin substrate formed of resin or a composite material which contains resin, or a ceramic substrate formed of alumina, glass ceramic, or a like ceramic material. Alternatively, the substrate may be a printed wiring substrate or a multilayer printed wiring substrate having a conductive layer(s), such as a wiring layer(s).

Solder used in the present invention can be selected as appropriate from among known types of solder in consideration of, for example, heat resistance of a substrate. Herein, the term "solder" refers to a soft brazing filler metal having a melting point of not higher than 450° C.

When a gold, hereinafter "Au" plating layer is formed on the surface of a pin, the Au plating layer enhances wettability with respect to solder. As a result, solder tends to spread broadly on the shaft side plane of the pin through wetting or tends to creep high along the shaft portion of the pin. Thus, when a pin coated with an Au plating layer is to be used, in order to limit spreading-through-wetting of solder or creeping-up-through-wetting of solder, use of solder exhibiting relatively low wettability with respect to the Au plating layer is preferred; specifically, use of solder containing antimony, hereinafter "Sb," such as solder of the tin-antimony, hereinafter "Sn—Sb," -type or solder of the lead-tin-antimony, hereinafter "Pb—Sn—Sb"-type.

Solder having an Sb content of not less than 3 wt % is particularly preferred. Through employment of an Sb content of not less than 3 wt %, solder wettability diminishes clearly to thereby reliably prevent spreading-through-wetting of solder or creeping-up-through-wetting of solder. In order to avoid difficulty in soldering associated with extreme diminution in solder wettability, the Sb content is preferably not greater than 15 wt %. Examples of such solder include solder of the 95Sn—5Sb type (melting point 235° C. to 240° C.) and solder of the 82Pb—10Sn—8Sb type (melting point 255° C. to 257° C.). When the thickness of the Au plating layer formed on the surface of a pin is not less than 0.04 μm, solder wettability is particularly enhanced. As a result, solder tends to spread broadly or creep up high, through wetting. Thus, selection of the above-mentioned solder is important in order to limit spreading-through-wetting of solder or creeping-up-through-wetting of solder.

Preferably, the above-mentioned solder extends from the pin pad beyond the circumferential edge of the shaft side plane of the enlarged diameter portion and spreads, through wetting, over the entire shaft side plane up to the shaft portion in such a manner as to form a fillet on the shaft side plane with an angle formed between the fillet surface and the shaft side plane being 5 degrees to 40 degrees.

According to the present invention, solder for joining the pin and the pin pad extends from the pin pad beyond the circumferential edge of the shaft side plane of the enlarged diameter portion and spreads, through wetting, over the entire shaft side plane up to the shaft portion. The fillet of solder formed on the shaft side plane is a relatively minor fillet in which an angle formed between the fillet surface and the shaft side plane is 5 degrees to 40 degrees.

Through employment of soldering as mentioned above, the joint portion between the pin and the pin pad exhibits far more enhanced joining strength; the pin becomes far more deformable; and the barycenter of the joint portion is lowered to a much greater extent. Thus, the substrate having pins of the present invention exhibits resistance to fracture potentially caused by stress imposed on a pin, to thereby enhance reliability.

Preferably, the pin is heat treated at a temperature of not lower than 600° C., which is higher than a temperature at which the pin is joined to the pin pad by means of the aforementioned solder.

According to the substrate having pins of the present invention, the pin is heat treated at a temperature of not lower than 600° C., which is higher than a temperature at which the pin is joined to the pin pad by means of solder; i.e., which is higher than the soldering temperature of the pin. A material wire from which the pin is formed, is formed through drawing to a predetermined diameter, during which the material wire is work-hardened due to residual strain associated with working. Also, when the enlarged diameter portion of the pin is formed and when the material wire is cut, strain associated with working is generated, and thus residual stress is generated, causing hardening of the pin. A temperature which is imposed on the thus-hardened pin during soldering (for example, approximately 200° C. to 300° C., 450° C. to 500° C. at the highest) is not sufficiently high to free the pin from work hardening. As a result, the pin fails to ease stress imposed on the pin through deformation. The stress tends to be imposed on the joint portion, potentially causing fracture of the joint portion.

According to the substrate having pins of the present invention, the pin is heat treated at a temperature of not lower than 600° C., which is higher than a temperature at which the pin is joined to the pin pad by means of solder. Thus, no stress remains in the pin, to thereby impart flexibility to the pin. When stress is imposed on the pin, the pin can ease the stress through deformation, thereby preventing fracture of the joint portion and thus imparting enhanced joining strength to the substrate.

When the substrate is a resin substrate made of resin or a composite material which contains resin, use of a pin which is previously heat treated as mentioned above is particularly preferred, because a pin to which flexibility has been imparted through removal of residual strain associated with working can be used with even a resin substrate of low heat resistance which exhibits no resistance to a high temperature of not lower than 600° C.; for example, a resin substrate resistant to a temperature of 300° C. to 450° C.

Thus it is an object of the invention is to provide an upright pin-joined substrate resistant to fracture potentially caused by stress imposed on a pin.

It is a further object of the present invention to provide a plate-like substrate having a plurality of upright pins secured by solder.

Further objects and advantages of the present invention will become apparent by reference to the following description of the preferred embodiments and appended drawings wherein like number refer to the same component element or feature.

DESCRIPTION OF THE PREFERRED EMBODIMENTS

A first embodiment of the present invention will next be described in detail with reference to the drawings.

Figure 1:
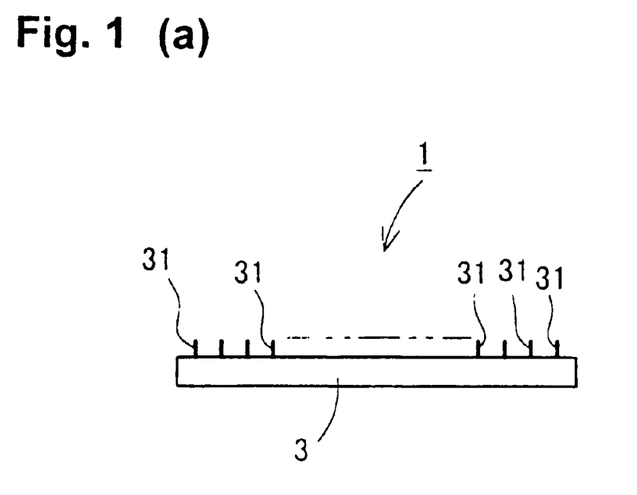
FIG. 1(a) is a side elevational view of a resin substrate having pins according to a first embodiment of the present invention.
FIG. 1(b) is a partially enlarged, sectional view of a resin substrate having pins according to a first embodiment of the present invention.

Referring now to FIGS. 1(a) and 1(b), the upright pin-joined resin substrate 1 includes a substantially rectangular, plate-like resin substrate 3, a plurality of pins 31 arranged on the resin substrate 3 in a standing condition, and a solder HD (95Sn—5Sb) for joining the pins 31 to the resin substrate 3.

The resin substrate 3 is a multilayer printed wiring substrate made of resin, which includes a plurality of dielectric resin layers 5A and 5B made of an epoxy resin and a solder resist layer 7 made of an epoxy resin and disposed on the surface thereof.

Conductor layers 9A and 9B including wiring and pads are formed respectively between the dielectric resin layer 5A and the solder resist layer 7 and between the dielectric resin layers 5A and 5B. A number of via conductors 11 and through-hole conductors (not shown) are formed in the dielectric resin layers 5A and 5B in order to establish connection between the conductor layers 9A and 9B.

The solder resist layer 7 forms a main surface 3A of the resin substrate 3. A number of openings 7K are formed in the solder resist layer 7 at predetermined positions. Pin pads 9AP, which are portions of the conductor layer 9A formed between the dielectric resin layer 5A and the solder resist layer 7, are exposed through the corresponding openings 7K.

A pin 31 is made of the 194-alloy. A nickel, hereinafter "Ni," plating layer (not shown) having a thickness of approximately 3.34 μm is formed on the surface of the pin 31, and an Au plating layer (also not shown) having a thickness of approximately 0.35 μm is formed on the Ni plating layer. The pin 31 includes a shaft portion 31A and an enlarged diameter portion 31B, which is formed at one end of the shaft portion 31A. The shaft portion 31A assumes a substantially columnar shape having a diameter of approximately 0.45 mm and a height (axial length) of approximately 3.01 mm. The enlarged diameter portion 31B is greater in diameter than the shaft portion 31A and includes a substantially circular shaft side plane 31BH located on the same side as the shaft portion 31A and a spherical surface 31BK swelling in opposition to the shaft portion 31A, to thereby assume a substantially hemispherical shape. The enlarged diameter portion 31B has a maximum diameter (a diameter of the shaft side plane 31BH) of approximately 1.1 mm and a height (axial length) of approximately 0.34 mm.

The pin 31 is joined to a pin pad 9AP of the resin substrate 3 by means of the solder HD such that the enlarged diameter portion 31B (spherical surface 31BK) faces the pin pad 9AP. More specifically, the solder HD for joining the pin 31 and the pin pad 9AP extends from the pin pad 9AP beyond a circumferential edge 31BHS of the shaft side plane 31BH of the enlarged diameter portion 31B and spreads on the shaft side plane 31BH through wetting, to thereby form a fillet FH extending between the shaft side plane 31BH and the pin pad 9AP and assuming substantially the form of a truncated cone. The solder HD spreads on the shaft side plane 31BH through wetting in such a manner as not reach the shaft portion 31A. Since the pin 31 is coated with the Au plating layer having a thickness of approximately 0.35 μm, which is thicker than 0.04 μm, as mentioned above, the pin 31 exhibits high wettability with respect to solder. However, according to the present embodiment, the solder HD is made of 95Sn—5Sb, which contains Sb in an amount of not less than 3 wt %, to thereby limit spreading-through-wetting.

As mentioned above, in the upright pin-joined resin substrate 1, the solder HD extends beyond the circumferential edge 31BHS of the shaft side plane 31BH of the enlarged diameter portion 31B and spreads on the shaft side plane 31BH through wetting; thus, a sufficient amount of the solder HD is present at the joint portion. Accordingly, even when stress is imposed on the pin 31, the joint portion between the pin 31 and the pin pad 9AP is not likely to be fractured.

The solder HD spreads through wetting in such a manner as not to reach the shaft portion 31A, to thereby avoid impairment in the joining strength between the pin 31 and the pin pad 9AP that would otherwise result from excessiveness in the amount of the solder HD.

According to the present embodiment, the thickness of the solder HD as measured between the pin pad 9AP and a point on the spherical surface 31BK of the enlarged dimeter portion 31B which is closest to the pin pad 9AP falls within a range of from 5 μm to 50 μm (specifically, approximately 20 μm). Through employment of a minimum thickness of the solder HD of not less than 5 μm, stress tends to be dispersed over the entire spherical surface 31BK. Also, through employment of a minimum thickness of the solder HD of not greater than 50 μm, the barycenter of the joint portion is lowered accordingly. As a result, the joint portion becomes unlikely to be fractured.

By virtue of a synergistic effect of the above-mentioned features, the upright pin-joined resin substrate 1 exhibits resistance to fracture potentially caused by stress imposed on the pin 31 and thereby exhibits enhanced reliability.

Since the pin 31 is treated at a high temperature of 600° C. prior to joining by means of the solder HD, which will be described later, the pin 31 is rendered flexible by virtue of absence of residual stress. Thus, through deformation of the pin 31 itself, imposed stress can be eased.

Figure 2:
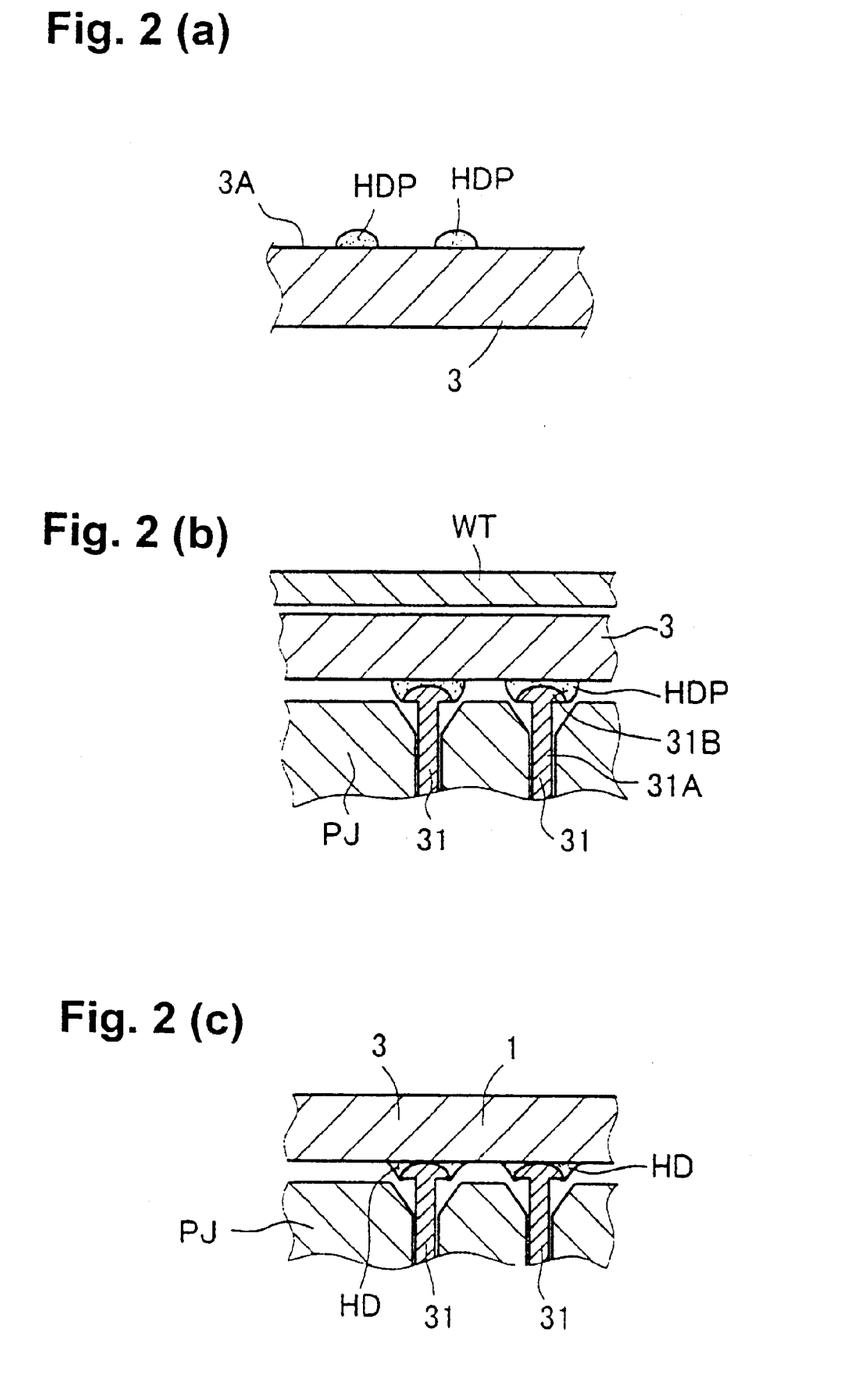
FIG. 2(a) shows a first step of a method for manufacturing the upright pin-joined substrate according to the first embodiment after the solder paste has been applied onto a resin substrate.
FIG. 2(b) shows a second step of a method for manufacturing the upright pin-joined substrate after the resin substrate has been placed on a pin standing jig.
FIG. 2(c) shows a third step of a method for manufacturing the upright pin-joined substrate after the solder paste has been reflowed.

Next, a method for manufacturing the upright pin-joined resin substrate 1 will be described with reference to FIG. 2.

First, the pin 31, which is manufactured as described below, is prepared. A material wire made of 194-alloy and having a substantially circular cross section is subjected to press working to thereby form the enlarged diameter portion 31B. Subsequently, the material wire is cut at a predetermined position to thereby form the shaft portion 31A, which has a diameter substantially equal to that of the material wire. The thus-obtained pin 31 is subjected to a surface smoothing process by means of known barrel polishing and chemical etching.

Next, the pin 31 is subjected to a heat treatment process, where the pin is heated to a temperature of 600° C. to 900° C. (780° C. to 850° C. in the present embodiment), and is then cooled slowly. Heating the pin 31 to a high temperature of not lower than 600° C. removes from the pin 31 residual stress which was generated during manufacture of the material wire and during working on the material wire to obtain the pin 31, to thereby impart flexibility to the pin 31.

Accordingly, in the upright pin-joined resin substrate 1, when stress is imposed on the pin 31, the pin 31 itself deforms to thereby absorb the stress. Since stress imposed on the joint portion between the pin 31 and the pin pad 9AP is reduced, the upright pin-joined resin substrate 1 becomes unlikely to fracture.

Temperature in heating the pin 31 is limited to not lower than 900° C. for the following reason. Since the pin 31 is made of the 194-alloy (a copper alloy), heating to a temperature in excess of 900° C. may cause the pin 31 to melt. This is also applicable to the pin 31 made of pure copper (oxygen-free copper).

Subsequently, in order to prevent oxidation of the pin 31, the pin 31 is plated with Ni and then plated with Au to thereby form an Ni—Au plating layer on the surface thereof, thereby yielding the above-mentioned pin 31.

Next, the above-mentioned resin substrate 3 is prepared. The resin substrate 3 is manufactured by a known method; specifically, by the steps of alternately forming the dielectric resin layers 5A and 5B and the conductor layers 9A and 9B, and forming the solder resist layer 7.

Next, in a solder printing process, as shown in FIG. 2(a), a predetermined amount of a solder paste HDP is deposited, through printing, on each of the pin pads 9AP exposed on the main surface 3A of the resin substrate 3.

Subsequently, in a placement process, as shown in FIG. 2(b), the pins 31 are set in a pin standing jig PJ, and the resin substrate 3 on which the solder paste HDP is deposited through printing is placed on the pin standing jig PJ in such a manner as to align the enlarged diameter portions 31B of the pins 31 with the corresponding pin pads 9AP. Then, a weight WT is placed on the resin substrate 3 to thereby press the resin substrate 3.

Next, in a reflow process, the resin substrate 3 placed on the pin standing jig PJ and both are placed in a reflow furnace. As shown in FIG. 2(c), the solder paste HDP is caused to reflow at a maximum temperature of 250° C. to 260° C. to thereby solder the enlarged diameter portions 31B of the pins 31 to the corresponding pin pads 9AP. Thus is completed the above-mentioned upright pin-joined resin substrate 1.

As understood easily from the above, according to the present embodiment, the pins 31 are previously heat treated at a temperature not lower than 600° C., which is higher than a heating temperature in soldering (in the reflow process). Thus, even when the resin substrate 3, which is low in heat resistance, is used, stress imposed on the pin 31 can be eased through deformation of the pin 31.

According to the present embodiment, the Au plating layer is formed on the surface of the pin 31. However, spreading-through-wetting of solder could be limited because of use of the solder HD that contains Sb in an amount of not less than 3 wt %.

A second embodiment of the present invention will be next be described in detail with reference to the drawings. Description of features similar to those of the above-described first embodiment will be omitted or briefed.

Figure 3:
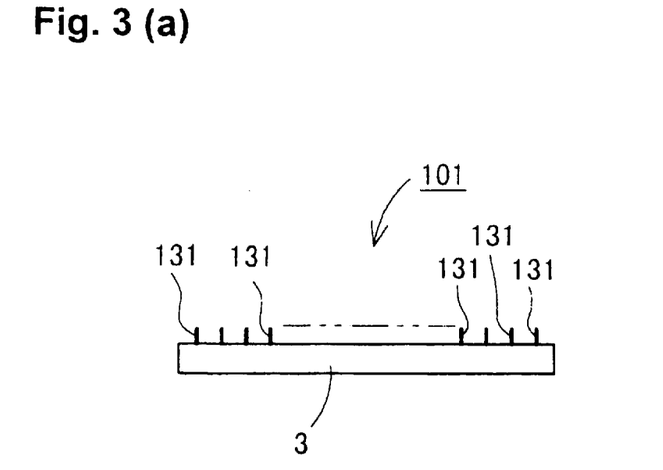
FIG. 3(a) is a side elevational view of a resin substrate having pins according to a second embodiment of the present invention.
FIG. 3(b) is a partially enlarged sectional view of a resin substrate having pins according to a second embodiment of the present invention.

Referring now to FIGS. 3(a) and 3(b), an upright pin-joined resin substrate 101 includes a resin substrate 3 similar to that of the first embodiment, a number of pins 131 arranged on the resin substrate 3 in a standing condition, and a solder HN (95Sn—5Sb) for joining the pins 131 to the resin substrate 3.

Each of the pins 131 include a shaft portion 131A, a substantially disk-like disk segment 131C greater in diameter than the shaft portion 131A and formed at one end of the shaft portion 131A and a substantially hemispherical, hemispherical segment 131D formed on the substantially entire surface of the disk segment 131C. In other words, the pin 131 includes the shaft portion 131A, the disk segment 131C having a shaft side plane 131BH located on the same side as the shaft portion 131A, and the hemispherical segment 131D having a spherical surface 131BK swelling in opposition to the shaft portion 131A.

The shaft portion 131A assumes a substantially columnar shape having a diameter of approximately 0.45 mm and a height (axial length) of approximately 3.01 mm. The disk segment 131C of the enlarged diameter portion 131B has a diameter of approximately 1.1 mm and a height (axial length) of approximately 0.2 mm. The hemispherical segment 131D of the enlarged diameter portion 131B has a diameter of 1.1 mm and a height (axial length) of approximately 0.1 mm.

The shaft portion 131A and the disk segment 131C of the enlarged diameter portion 131B are integrally formed of the 194-alloy. The hemispherical segment 131D of the enlarged diameter portion 131B is formed of a brazing filler metal (the silver-copper, hereinafter "Ag—Cu," eutectic silver brazing filler metal).

As in the case of the pin 31 of the first embodiment, an Ni—Au plating layer (thickness of Ni: approx. 3.34 μm; and thickness of Au: approx. 0.35 μm) is formed on the surface of the pin 131.

The pin 131 is joined to the pin pad 9AP of the resin substrate 3 by means of the solder HN such that the enlarged diameter portion 131B (spherical surface 131BK) faces the pin pad 9AP. More specifically, the solder HN for joining the pin 131 and the pin pad 9AP extends from the pin pad 9AP beyond a circumferential edge 131BHS of the shaft side plane 131BH of the enlarged diameter portion 131B and spreads on the entire shaft side plane 131BH through wetting in such a manner as to reach the shaft portion 131A. A lower fillet FS assuming substantially the form of a truncated cone is formed in such a manner as to extend between the pin pad 9AP and the shaft side plane 131BH. Also, an upper fillet FU is formed on the shaft side plane 131BH by means of the solder HN. The upper fillet FU is a relatively small fillet such that the angle between the surface of the fillet FU and the shaft side plane 131BH is not greater than 50 degrees and more particularly falls within a range of from 5 degrees to 40 degrees; specifically, approximately 12 degrees.

As mentioned above, the Au plating layer having a thickness of approximately 0.35 μm, which is thicker than 0.04 μm, is formed on the pin 131 and is thus wettable with respect to solder. However, also, according to the present embodiment, the solder HN is made of 95Sn—5Sb, which contains Sb in an amount of not less than 3 wt %, to thereby limit spreading-through-wetting of solder and creeping-up-through-wetting of solder.

As mentioned above, in the upright pin-joined resin substrate 101, the solder HN extends beyond the circumferential edge 131BHS of the shaft side plane 131BH of the enlarged diameter portion 131B and spreads on the shaft side plane 131BH through wetting; thus, a sufficient amount of the solder HN is present at the joint portion. Accordingly, even when stress is imposed on the pin 131, fracture of the joint portion that would otherwise result from insufficiency of solder is suppressed.

The solder HN spreads on the entire shaft side plane 131BH through wetting in such a manner as to reach the shaft portion 131A, thereby forming the upper fillet FU on the shaft side plane 131BH. However, the upper fillet FU is relatively small, to thereby avoid impairment in the joining strength between the pin 131 and the pin pad 9AP that would otherwise result from excessiveness in the amount of solder.

Thus, the upright pin-joined resin substrate 101 exhibits resistance to fracture potentially caused by stress imposed on the pin 131 and thereby exhibits enhanced reliability.

The upright pin-joined resin substrate 101 can be manufactured in a manner similar to that of the first embodiment. That is, the pins 131 and the resin substrate 3 are prepared. Then, the pins 131 are fixedly joined to the resin substrate 3 through practice of a solder printing process, a placement process, and a reflow process while using the solder HN.

When the hemispherical segment 131D of the pin 131 is formed, the shaft portion 131A and the disk segment 131C are also heated to a high temperature of not lower than 600° C. (specifically 780° C. to 850° C.). Accordingly, as in the case of the first embodiment, the shaft portion 131A and the disk segment 131C are rendered flexible by virtue of absence of residual stress. Thus, stress imposed on the pin 131 can be eased through deformation of the pin 131. This feature also contributes to attainment of resistance to fracture and enhancement of reliability.

Next, the relationship of the amount and profile of solder to the joining strength between a pin and a pin pad will be described with reference to Table 1.

The effect of the amount and profile of solder for joining the pin and the pin pad on the joining strength between the pin and the pin pad was studied in the following manner.

First, the pins 131 and the resin substrates 3 according to the second embodiment were prepared. In the aforementioned solder printing process, solder paste was applied through printing in six different amounts to thereby manufacture six kinds of upright pin-joined resin substrates 101.

Next, the upright pin-joined resin substrates 101 were subjected to a tensile strength on the pins 131. Among a number of pins 131 standing on the upright pin-joined resin substrate 101, an appropriate pin 131 was pinched and pulled at a rate of 15 mm/min at an angle of 30 degrees with respect to the axial direction of the pin 131 to thereby obtain the fracture strength of the upright pin-joined resin substrate 101.

TABLE 1

| Amount of solder (g/PKG) | Profile of Solder | Number of samples: 5 each Joining Strength (N) |
|---|---|---|
| 0.221 | Does not extend beyond circumferential edge of shaft side plane | 30.3 |
| 0.314 | Extends beyond circumferential edge of shaft side plane but does not reach shaft portion | 41.9 |
| 0.458 | Forms upper fillet at 6 to 23 degrees | 54.6 |
| 0.561 | Forms upper fillet at 22 to 38 degrees | 50.2 |
| 0.650 | Forms upper fillet at 41 to 49 degrees | 43.4 |
| 0.750 | Forms upper fillet at 55 to 65 degrees | 29.7 |

The test results are shown in Table 1. The amount of solder HN is the total amount of solder used for 370 pins 131 standing on the upright pin-joined substrate 101. The value of strength is the average of five measurements with respect to five pins 131 which were tested for tensile strength for each of the amounts of solder HN.

As seen from Table 1, in the case of the smallest amount of solder HN for joining the pin 131 and the pin pad 9AP (0.221 g/PKG), the solder HN does not extend from the pin pad 9AP beyond the circumferential edge 131BHS of the shaft side plane 131BH of the enlarged diameter portion 131B (see the state of the solder HA shown in FIG. 4), with a resultant low joining strength of 30.3 N (=3.09 kgf) between the pin 131 and the pin pad 9AP.

In the case of the largest amount of solder HN (0.750 g/PKG), the solder HN extends from the pin pad 9AP beyond the circumferential edge 131BHS of the shaft side plane 131BH of the enlarged diameter portion 131B and spreads on the entire shaft side plane 131BH through wetting in such a manner as to reach the shaft portion 131A, to thereby form the upper fillet FU on the shaft side plane 131BH such that the angle between the fillet surface and the shaft side plane 131BH is 55 to 65 degrees. As in the case of the extremely small amount of solder HN (0.221 g/PKG), in the case of the extremely large amount of solder HN, the joining strength between the pin 131 and the pin pad 9AP drops to 29.7 N (=3.03 kgf).

In the case of an amount of solder HN of 0.314 g/PKG, the solder HN extends from the pin pad 9AP beyond the circumferential edge 131BHS of the shaft side plane 131BH of the enlarged diameter portion 131B and spreads on the shaft side plane 131BH through wetting in such a manner as not to reach the shaft portion 131A (see the state of the solder HD shown in FIG. 1(b)). In this case, in contrast to the above-mentioned case of the extremely small or large amount of solder HN, the joining strength between the pin 131 and the pin pad 9AP assumes a sufficiently high value of 41.9 N (=4.28 kgf).

In the case of the increased amount of solder HN (0.458 g/PKG, 0.561 g/PKG, or 0.650 g/PKG), the solder HN extends from the pin pad 9AP beyond the circumferential edge 131BHS of the shaft side plane 131BH of the enlarged diameter portion 131B and spreads on the entire shaft side plane 131BH through wetting in such a manner as to reach the shaft portion 131A, to thereby form the upper fillet FU on the shaft side plane 131BH (see FIG. 3(b)). The angle between the fillet surface and the shaft side plane is 6 degrees to 23 degrees at an amount of solder HN of 0.458 g/PKG, 22 to 38 degrees at an amount of solder HN of 0.561 g/PKG, and 41 degrees to 49 degrees at an amount of solder HN of 0.650 g/PKG. Also, in these cases, in contrast to the above-mentioned case of the extremely small or large amount of solder HN, the joining strength between the pin 131 and the pin pad 9AP assumes a sufficiently high value of 54.6 N (=5.57 kgf), 50.2 N (=5.12 kgf), and 43.4 N (=4.43 kgf), respectively. In particular, in the case of an amount of solder HN of 0.458 g/PKG or 0.561 g/PKG; i.e., in the case of an angle of 6 degrees to 38 degrees between the fillet surface and the shaft-portion plane, the joining strength becomes very high.

Judging from the above test results, the joining strength between the pin 131 and the pin pad 9AP is enhanced when the solder HN extends from the pin pad 9AP beyond the circumferential edge 131BHS of the shaft side plane 131BH of the enlarged diameter portion 131B and spreads on the shaft side plane 131BH through wetting in such a manner as not to reach the shaft portion 131A.

Also, the joining strength between the pin 131 and the pin pad 9AP is enhanced when the solder HN extends from the pin pad 9AP beyond the circumferential edge 131BHS of the shaft side plane 131BH of the enlarged diameter portion 131B and spreads, through wetting, over the entire shaft side plane 131BH up to the shaft portion 131A in such a manner as to form the relatively small, upper fillet FS with an angle formed between the fillet surface and the shaft side plane 131BH not exceeding 50 degrees.

Furthermore, the joining strength between the pin 131 and the pin pad 9AP is further enhanced when the solder HN extends from the pin pad 9AP beyond the circumferential edge 131BHS of the shaft side plane 131BH of the enlarged diameter portion 131B and spreads, through wetting, over the entire shaft side plane 131BH up to the shaft portion 131A in such a manner as to form the relatively small, Pig upper fillet FS with an angle formed between the fillet surface and the shaft side plane 131BH being 5 degrees to 40 degrees.

The above study was conducted while using the pins 131 according to the second embodiment. A similar study was conducted while using the pins 31 according to the first embodiment. The test results were similar to those described above.

While the present invention has been described with reference to the first and second embodiments, the present invention is not limited thereto, but may be modified as appropriate without departing from the spirit or scope of the invention.

For example, the first or second embodiment is described while mentioning a substrate having pins (the upright pin-joined resin substrate 1 or 101) composed of a multilayer printed wiring substrate formed of resin (the resin substrate 3), such as epoxy resin, and the pins 31 or 131 arranged on the multilayer printed wiring substrate in a standing condition. However, effect similar to that described above can also be obtained from another form of substrate, such as a ceramic substrate formed of alumina, aluminum nitride, mullite, or low temperature fired glass-ceramic, on which the pins 31 or 131 are arranged in a standing condition.

The first or second embodiment is described while mentioning the pins 31 or 131 made of the 194-alloy. However, the present invention is not limited thereto. For example, pins made of Koval or the 42-alloy can be used. According to the first or second embodiment, the pins 31 or 131 are heat treated at a temperature of not lower than 600° C. Pins made of Koval or the 42-alloy are also heat treated preferably at a temperature of not lower than 600° C., more preferably at a temperature of not lower than 700° C. in order to reliably render the pins flexible. In consideration of a melting point, pins made of Koval or the 42-alloy are heat treated preferably at a temperature of not higher than 1200° C.

When pins are heat treated before being fixedly joined to a substrate as described above, the pins to which flexibility has been imparted can be used with a resin substrate, which is low in heat resistance and exhibits no resistance to high temperature not lower than 600° C., as shown in the embodiments. Therefore, use of such pins are particularly preferred.

Also, when flexibility is imparted to pins beforehand through heat treatment, such pins having flexibility can be used with a substrate formed of low temperature fired glass ceramic, for which the pins are joined to the substrate through soldering at relatively low temperature. This is also applicable to other ceramic substrates, such as an alumina substrate.

Obviously, numerous modifications and variations of the present invention are possible in light of the above teachings. It is therefore to be understood that within the scope of the appended claims, the present invention may be practiced otherwise than as specifically described herein.

What is claimed is:

1. A substrate having pins, comprising, in combination,
a substrate having a main surface, a substantially plate-like shape and a pin pad exposed on the main surface;
a pin defining an external surface covered with a gold layer having a thickness of at least 0.04 $\mu$m and comprising:
a shaft portion; and
an enlarged diameter portion greater in diameter than the shaft portion and formed at one end of the shaft portion, comprising a shaft side plane located on the same side as the shaft portion, and a spherical surface swelling in opposition to the shaft portion; and
solder for joining the pin pad and at least the enlarged diameter portion of said pin;
wherein said solder extends from the pin pad beyond the circumferential edge of the shaft side plane of the enlarged diameter portion and spreads on the shaft side plane through wetting in such a manner as not to reach the shaft portion.

2. The substrate having pins as described in claim 1, wherein said pin is heat treated at a temperature of not lower than 600° Centigrade, which is higher than a temperature at which said pin is joined to the pin pad by means of said solder.

3. The substrate having pins as described in claim 1, wherein said pin is heat treated at a temperature of not lower than 600° Centigrade, which is higher than a temperature at which said pin is joined to the pin pad by means of said solder.

4. The substrate having pins as described in claim 1, wherein said solder contains tin in an amount not less than 3 wt % but not greater than 15 wt %.

5. A substrate having pins, comprising, in combination,
a substrate having a main surface, a substantially plate-like shape and a pin pad exposed on the main surface;
a pin having an exterior surface covered with a gold layer having a thickness of at least 0.04 μm and comprising:
a shaft portion; and
an enlarged diameter portion greater in diameter than the shaft portion and formed at one end of the shaft portion, comprising a shaft side plane located on the same side as the shaft portion, and a spherical surface swelling in opposition to the shaft portion; and
solder for joining the pin pad and at least the enlarged diameter portion of said pin;
wherein said solder extends from the pin pad beyond the circumferential edge of the shaft side plane of the enlarged diameter portion and spreads, through wetting, over the entire shaft side plane up to the shaft portion in such a manner as to form a fillet on the shaft side plane with an angle formed between a fillet surface and the shaft side plane not exceeding 50 degrees.

6. The substrate having pins as described in claim 5, wherein said pin is heat treated at a temperature of not lower than 600° Centigrade, which is higher than a temperature at which said pin is joined to the pin pad by means of said solder.

7. The substrate having pins as described in claim 5, wherein said solder extends from the pin pad beyond the circumferential edge of the shaft side plane of the enlarged diameter portion and spreads, through wetting, over the entire shaft side plane up to the shaft portion in such a manner as to form a fillet on the shaft side plane with an angle formed between the fillet surface and the shaft side plane being 5 degrees to 40 degrees.

8. The substrate having pins as described in claim 7, wherein said pin is heat treated at a temperature of not lower than 600° Centigrade, which is higher than a temperature at which said pin is joined to the pin pad by means of said solder.

9. The substrate having pins as described in claim 5, wherein said solder contains tin in an amount not less than 3 wt % but not greater than 15 wt %.

* * * * *